(12) United States Patent
Hopper et al.

(10) Patent No.: US 11,257,534 B2
(45) Date of Patent: *Feb. 22, 2022

(54) CURRENT MONITOR FOR A MEMORY DEVICE

(71) Applicant: Micron Technology, Inc., Boise, ID (US)

(72) Inventors: Kristen M. Hopper, Boise, ID (US); Debra M. Bell, Boise, ID (US); Aaron P. Boehm, Boise, ID (US)

(73) Assignee: Mircon Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,575

(22) Filed: Oct. 21, 2020

(65) Prior Publication Data

US 2021/0098046 A1 Apr. 1, 2021

Related U.S. Application Data

(63) Continuation of application No. 16/433,871, filed on Jun. 6, 2019, now Pat. No. 10,832,754.

(51) Int. Cl.
| | |
|---|---|
| *G11C 11/24* | (2006.01) |
| *G11C 11/22* | (2006.01) |
| *G11C 11/4074* | (2006.01) |
| *G06F 11/34* | (2006.01) |
| *G06F 11/30* | (2006.01) |
| *G11C 11/4076* | (2006.01) |

(52) U.S. Cl.
CPC ...... *G11C 11/2297* (2013.01); *G06F 11/3037* (2013.01); *G06F 11/3058* (2013.01); *G06F 11/3065* (2013.01); *G06F 11/3495* (2013.01); *G11C 11/221* (2013.01); *G11C 11/2293* (2013.01); *G11C 11/4074* (2013.01); *G11C 11/4076* (2013.01)

(58) Field of Classification Search
CPC .............. G11C 11/221; G11C 11/2293; G11C 11/4074
USPC ........................................................ 365/149
See application file for complete search history.

(56) References Cited

U.S. PATENT DOCUMENTS

| | | |
|---|---|---|
| 5,276,646 A | 1/1994 | Kim et al. |
| 5,442,586 A | 8/1995 | Javanifard et al. |
| 6,826,179 B1 | 11/2004 | Talbot et al. |

(Continued)

*Primary Examiner* — Vu A Le
(74) *Attorney, Agent, or Firm* — Holland & Hart LLP

(57) ABSTRACT

Methods, systems, and devices for a current monitor for a memory device are described. A memory device may monitor potential degradation of memory cells on the device by monitoring the amount of current drawn by one or more memory cells. As the memory cells degrade, the current supplied to the memory cells may change (e.g., increase due to additional leakage current. The memory device may indirectly monitor changes in the current supplied to the memory cells by monitoring a voltage of a node of a transistor that controls the amount of current supplied to the array of memory cells. The voltage at the control node may be compared to a reference voltage to determine whether the two voltages differ by a threshold amount, indicating that the memory cells are drawing more current. The memory device may output a status indicator when the voltages differ, for example, by the threshold amount.

20 Claims, 6 Drawing Sheets

(56) References Cited

U.S. PATENT DOCUMENTS

2010/0315878 A1* 12/2010 Edahiro .............. G11C 11/5642
365/185.21

* cited by examiner

CURRENT MONITOR FOR A MEMORY DEVICE

CROSS REFERENCE

The present Application for Patent is a continuation of U.S. patent application Ser. No. 16/433,871 by Hopper et al., entitled "CURRENT MONITOR FOR A MEMORY DEVICE," filed Jun. 6, 2019, assigned to the assignee hereof, and is expressly incorporated by reference in its entirety herein.

BACKGROUND

The following relates generally to a system that includes at least one memory device and more specifically to a current monitor for a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

In some cases, a memory device may be used within a system that is configured for or specifies a high level of reliability. Such systems may include, for example, automotive or other safety-related systems. The health of a memory device may degrade over time, however, which may lead to memory errors.

DETAILED DESCRIPTION

Figure 1:
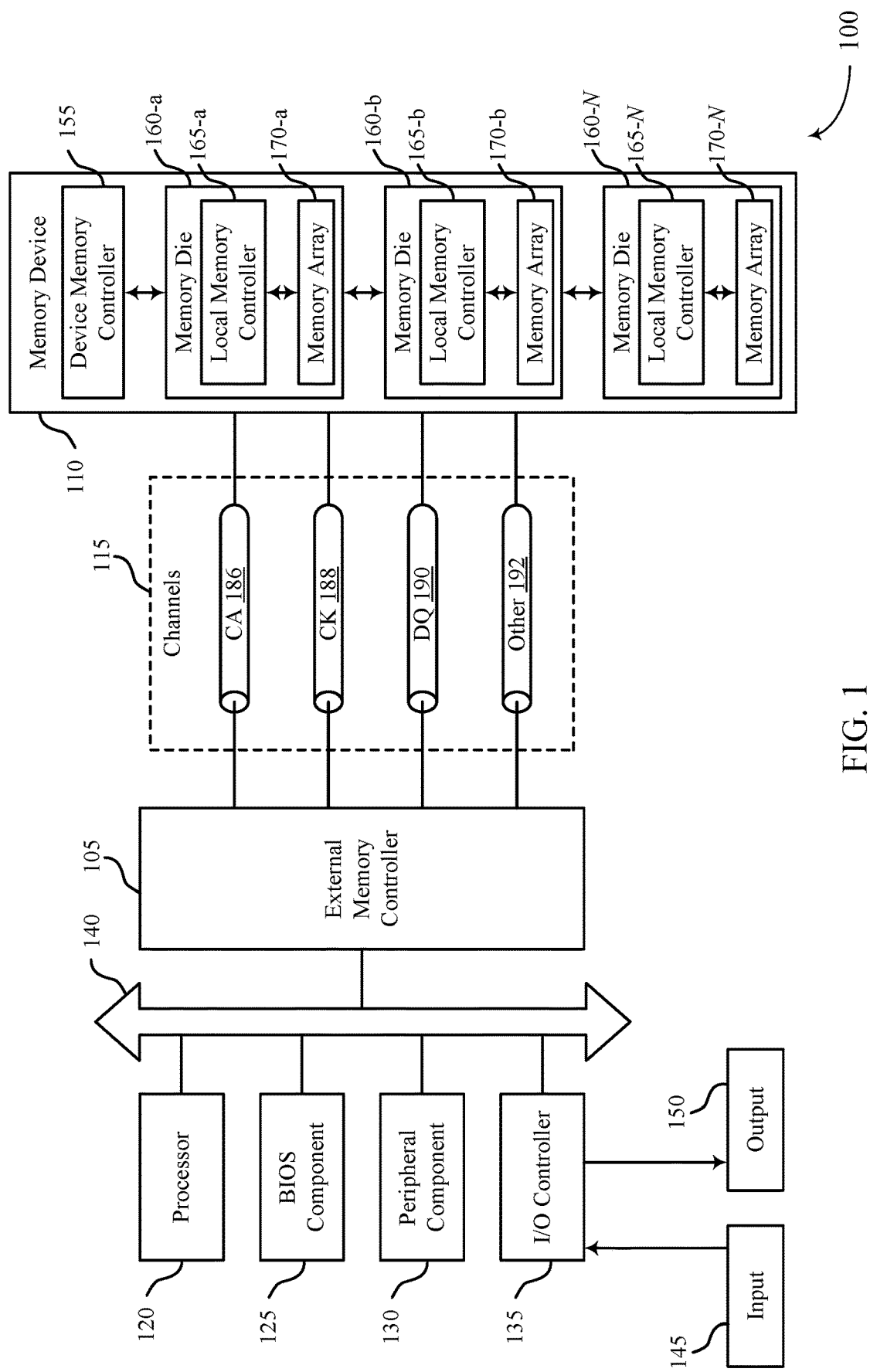
FIG. 1 illustrates an example of a system that supports a current monitor for a memory device in accordance with examples as disclosed herein.

In some cases, a memory device may be used within a system that specifies a high level of reliability. Such systems may include, for example, automotive or other safety-related systems. The health of a memory device may degrade over time, however, which may lead to memory errors. Such degradation may cause errors in the memory device, which may be particularly problematic for safety-related systems. Thus, in some cases, it may be desirable to monitor the health of a memory device (or a system that includes a memory device) to identify or predict degradation of the memory device or system before it reaches a significant or dangerous level.

Some memory cells, such as DRAM cells, may include a transistor and a capacitor. The transistor may be coupled with a word line, and may be used to select the memory cell. The capacitor may store a charge representing a logic state. Memory cells or other features of a memory device, such as buses or control signals, may degrade over time, which may cause errors in a memory device. For example, memory cells may degrade as the array of memory cells is repeatedly accessed, particularly if the memory device is operated under severe conditions (e.g., high temperatures), such as may be the case in some automotive applications. For example, repeatedly activating and pre-charging word lines to access memory cells in the array may induce stress in the cell transistors. This may, over time, increase an amount of leakage current through the cell transistors. The increase in leakage current may in turn cause the array of memory cells to draw more current. Thus, it may be possible to monitor or predict device degradation by monitoring the supply current to the array of memory cells.

Monitoring the supply current directly may be challenging, however, because it may include monitoring multiple locations within the device. Instead, a memory device may monitor the supply current indirectly by monitoring a voltage within the memory device that is used to control the amount of current supplied to the memory cells and/or to other circuitry on the memory device. A change in the monitored voltage may correspond to a change in the supply current. For example, the amount of current supplied to an array of memory cells or other circuitry may be controlled by applying a voltage to a gate of a transistor that supplies the current. If the transistor is an n-type transistor, an increase in the voltage applied at the gate may correspond to an increase in current through the transistor. If the transistor is a p-type transistor, a decrease in the voltage applied at the gate may correspond to an increase in current through the transistor. In some cases, a memory device may monitor a voltage at the gate of a transistor that is used to control the amount of current supplied to the array of memory cells. When this voltage increases (e.g., for an n-type transistor) or decreases (e.g., for a p-type transistor), the supply current also increases, and vice versa.

In some cases, a memory device may configure a voltage generator to provide a reference voltage against which the voltage that controls the amount of current may be compared to identify changes in the voltage, indicating changes in the amount of current supplied to the memory cells. For example, the memory device may, at a first time (e.g., corresponding to an initialization or bootup of the memory device), configure a voltage generator to generate a voltage that substantially matches the monitored voltage (e.g., the voltage at the gate of the transistor that is used to control the amount of current supplied to the array of memory cells). A memory device may subsequently maintain the reference voltage constant (e.g., by maintaining the voltage generator at the matched voltage) and monitor any changes in the difference between the reference voltage and the voltage used to control the current supplied to the memory cells to identify changes.

In some cases, the memory device may determine a status (e.g., a health condition) of the array of memory cells based on the difference between the monitored voltage and the reference voltage. The status of the array of memory cells may correspond to a level of degradation of the memory device. The memory device may output a status indicator to, for example, an external host device or to a register that may subsequently be read by an external host device. In this manner, a memory device may be capable of alerting an external device that its health may be degrading. Monitoring the level of degradation may increase the level of reliability of memory device.

Although the discussion herein primarily focuses on monitoring a current supplied to an array of memory cells on a memory device, similar techniques may be used to monitor the current supplied to other types of components (potentially on other types of devices) that may draw more current or less current over time due to various degradation mechanisms. Thus, the techniques described herein should not be considered as limited to memory devices or arrays of memory cells, nor to monitoring only increases in current. That is, the techniques described herein may be used for monitoring increases or decreases in the current supplied to other types of circuitry by monitoring increases or decreases in voltages.

Features of the disclosure are initially described in the context of a memory system and memory die as described with reference to FIGS. 1 through 3. These and other features of the disclosure are further illustrated by and described with reference to an apparatus diagram and flowcharts that relate to a current monitor for a memory device as described with references to FIGS. 4 through 6.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some cases, the host device may be an external host device; e.g., the host device may be off of the memory die, chip, or device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may include a two-dimensional (2D) array of memory cells or may include a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110.

In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

System 100 may be used in a may be used within a larger system that specifies a high level of reliability. Such systems may include, for example, automotive or other safety-related systems. Over time, system 100 may begin to degrade. In some cases, system 100 may, over the lifetime of system 100, experience relatively extreme operating conditions (e.g., temperatures exceeding 95° C.) for a large cumulative duration (e.g., up to 35,000 hours). The extreme conditions may cause system 100 to degrade more quickly than under it would degrade less severe operating conditions.

In some cases, it may be desirable to monitor the health of a memory device to identify or predict degradation of the memory device before it reaches a significant or dangerous level. In some cases, it may be desirable to monitor the health of the memory device frequently or nearly continuously, particularly if the memory device is used within a high-reliability system and may be subject to severe operating conditions.

In some cases, a memory device 110 may be configured to monitor its own health and provide an indicator of degradation levels (e.g., a health status indicator) to another component within system 100, such as an external host processor. By monitoring its own health and providing status indicators to other components, a memory device 110 may increase the reliability of system 100. In some cases, the status indicator may allow a larger system (e.g., a system that includes system 100 and other components) to determine or adjust a level of functionality system 100. For example, if the larger system relies upon system 100 for automation purposes, a low level of indicated degradation may correspond to the full functionality of system 100. Conversely, as the level of indicated degradation increases, the larger system may rely on less functionality of system 100. For example, the larger system may rely on system 100 for partial functionality (e.g., critical functionality) or no functionality.

Figure 2:
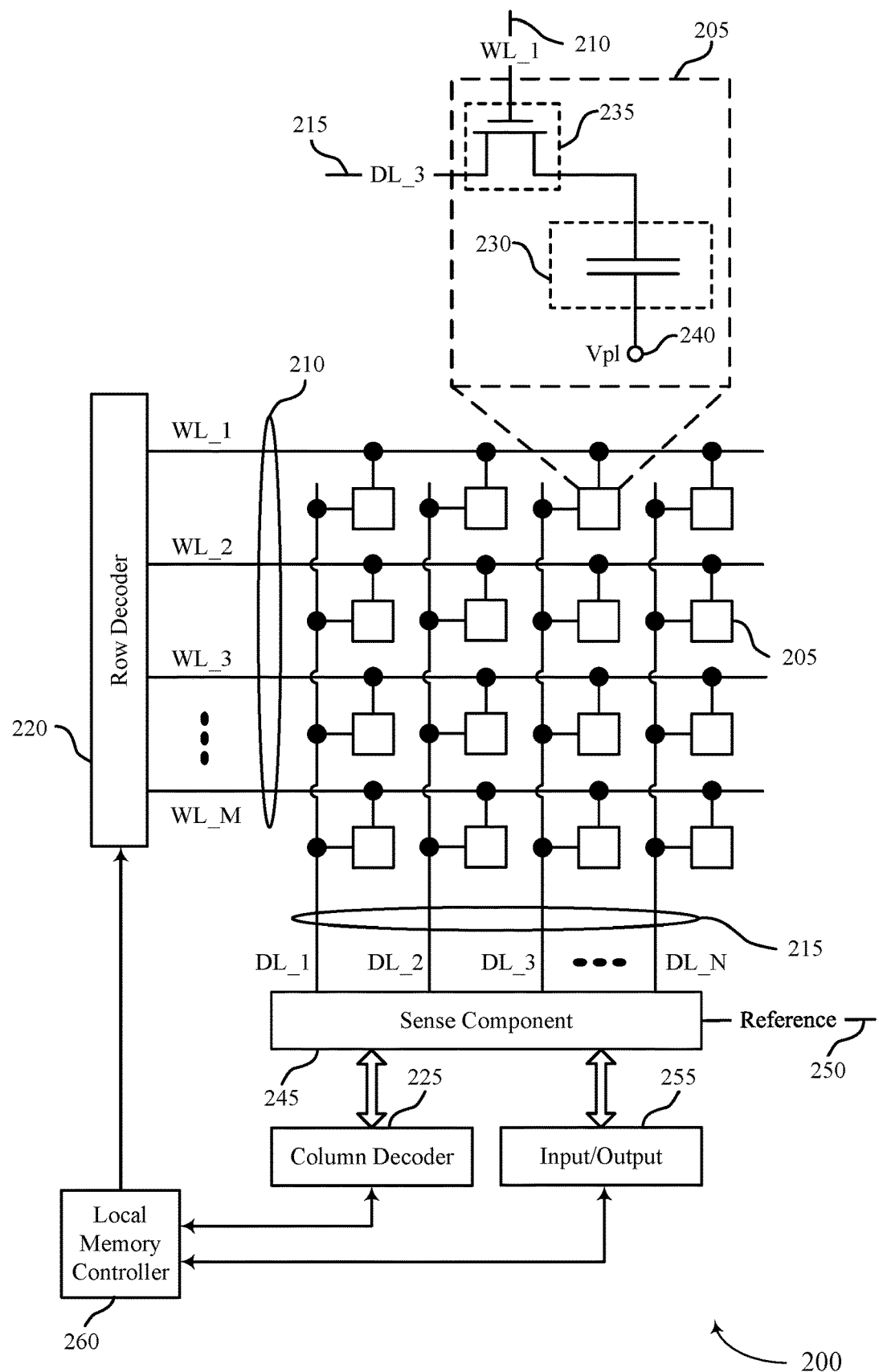
FIG. 2 illustrates an example of a memory die that supports a current monitor for a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM memory cells may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230, and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be a ground voltage, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

In some cases, local memory controller 260 may activate multiple (e.g., thousands (1000s)) neighboring word lines during the execution of an access operation on a target word line. For example, the controller 360 may activate neighboring word lines in order to perform a parity check corresponding to the access operation. Thus, by performing the one or more access operations, the local memory controller 260 may activate multiple word lines of the array of memory cells 370, which may select multiple memory cells 205 coupled with the word lines.

Over time, as memory cells are repeatedly selected for read or write operations and parity checks, the switching component 235 may experience various electrical phenomenon that may degrade the switching component 235. For example, if switching component 235 is a transistor, the transistor 235 may experience double gate-induced drain leakage (DGIDL) and/or hot electron induced punch-through (HEIP) when the memory cell 205 is selected, which may cause electrons to be trapped at the drain and/or source of the transistor 235. Such trapped electrons may increase the leakage current across the transistor 235 (e.g., drain-source leakage for a p-type transistor). In some cases, DGIDL and HEIP effects may interact (e.g., may increase the impact of each other) resulting in a combination that may accelerate degradation of transistor 235 and further increase the leakage current. The increase in leakage current across the transistor 235 may cause the transistor 235 to draw current even in an off state (e.g., when a word line 210 associated with transistor 235 is not activated). In some cases, as transistors 235 associated with one or more memory cells 205 of the memory die 200 begin to degrade and experience more leakage current, an array of memory cells 205 (or memory die 200 as a whole) may begin drawing more current. Thus, an increase in the amount of current supplied to an array of memory cells on memory die 200 may be associated with or indicative of an increased level of degradation of the memory array or memory die 200. As discussed in more detail with reference to FIG. 3, a memory die 200 may be configured to monitor this increase as an indication of the health status of memory die 200. In some cases, a memory die 200 may be configured to use similar techniques to monitor a current increase to other components on memory die 200.

In some cases, an increase in a voltage supplied to an array of memory cells or to other components on memory die 200 may be associated with or indicative of an increased level of degradation of the memory array or memory die 200. Thus, in some cases, a memory die may be configured to monitor an increase in a voltage on memory die 200 as an indication of the health status of memory die 200, in addition to or instead of monitoring an amount of current supplied to an array of memory cells or to other components.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory die 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state. In some cases, the local memory controller 260 may apply a precharge voltage before (and in some cases following) a write operation. The precharge voltage may be some voltage between a voltage corresponding to an inactivated state and an activated state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation. In some cases, the local memory controller 260 may apply a precharge voltage before (and in some cases following) a read operation. The precharge voltage may be some voltage between a voltage corresponding to an inactivated state and an activated state.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some cases, a memory die 200 may include additional components and circuitry configured to detect changes in the amount of current supplied to an array of memory cells (and/or other components) on memory die 200 and output a status indicator based on detected changes, as described in more detail with reference to FIG. 3.

Figure 3:
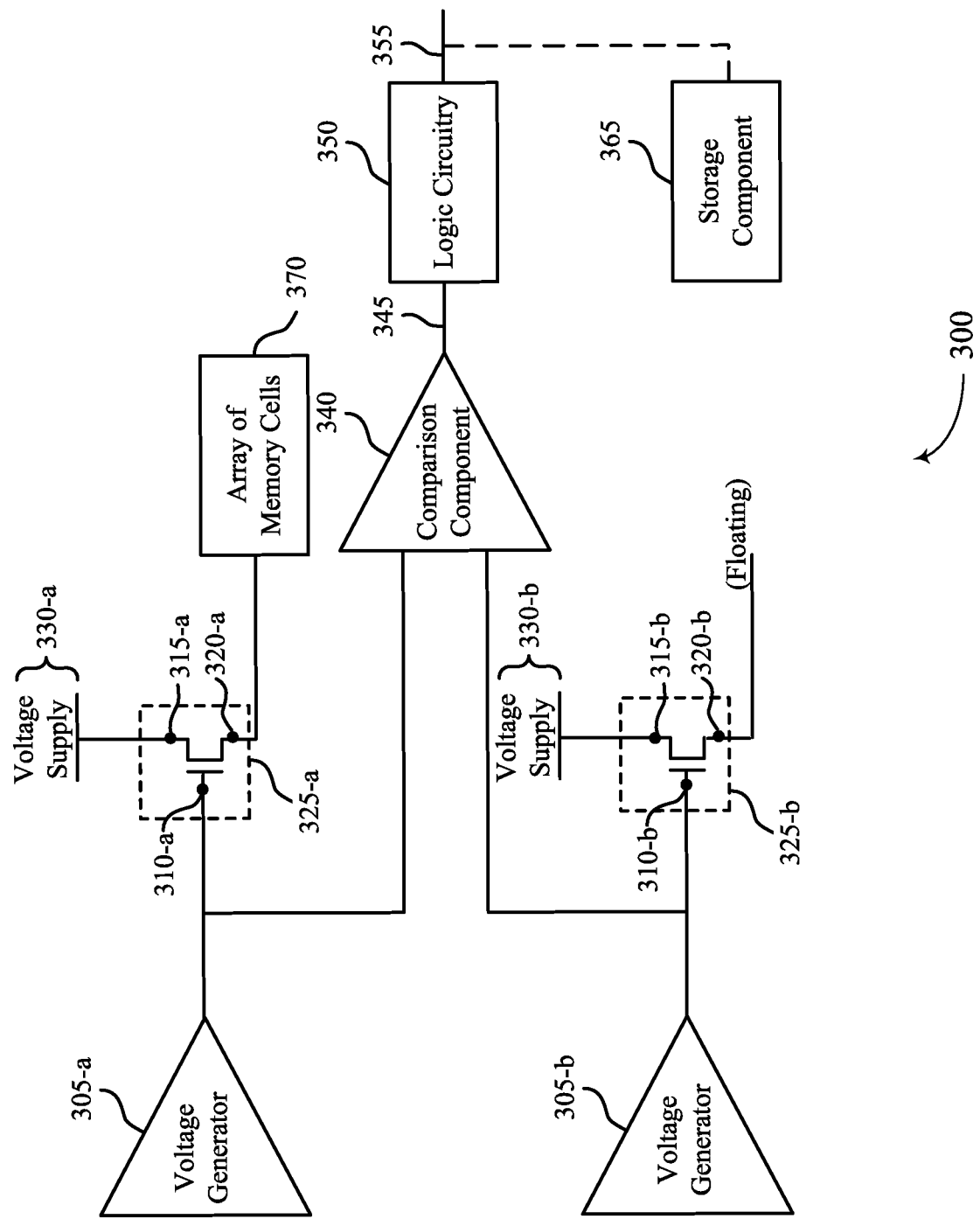
FIG. 3 illustrates an example of a system that supports a current monitor for a memory device in accordance with examples as disclosed herein.

FIG. 3 illustrates an example of a system 300 that supports a current monitor for a memory device in accordance with examples as disclosed herein. The system 300 may represent a portion of a memory device and may include one or more components described herein with reference to FIGS. 1 and 2, among others. For example, the system 300 may include an array of memory cells 370, which may include memory cells 205 as described with reference to FIG. 2. The system 300 may also include voltage generators 305, transistors 325, voltage supplies 330, a comparison component 340, logic circuitry 350, and a storage component 365.

Memory access operations, such as read or write operations and corresponding parity check operations, may, over time, result in a degradation of the array of memory cells 370. For example, the repeated activation of target word lines (for an access operation) and neighboring word lines (for parity check operations) may result in degradation of one or more transistors (e.g., transistors 235) of the array of memory cells 370. Such transistors may be, for example, p-type or n-type MOS transistors, or another type of transistor, for example. Activating the word lines may correspond to applying a voltage to the control node (e.g., a gate) of transistors in memory cells of the array of memory cells 370, which may degrade the cell transistors over time due to, for example, DGIDL, HEIP, and/or other undesirable effects. The degradation of the transistors may result in increasing leakage current from the drain node of the transistor to the source node of the transistor (e.g., for p-type transistors) or the reverse (for n-type transistors). The drain-source leakage may cause the transistor to draw current even in an off state (e.g., when a word line associated with the transistor is not activated), causing the memory cell to draw current when it is not selected. Thus, degradation of the array of memory cells 370 (e.g., corresponding to a degradation of one or more transistors in memory cells within the array of memory cells 370) may result in increased or decreased current demand from the array of memory cells 370. That is, as the transistors within memory cells of the array of memory cells 370 degrade, the array of memory cells 370 may draw (e.g., consume or need) more or less current during operation. Other components (e.g., components other than memory cells) may draw more or less current due to other degradation mechanisms.

Voltage supplies 330 may generate or provide supply voltages for a memory die (e.g., memory die 200 as described with reference to FIG. 1). In some cases, voltage supplies 330-a and 330-b may be a common voltage supply for system 300, such as a VDD voltage supply.

Voltage generator 305-a, transistor 325-a, and voltage supply 330-a may be configured to work together to supply a current (e.g., a supply current) to the array of memory cells 370 to support operation of the array of memory cells 370. For example, voltage supply 330-a may provide a supply voltage, such as a VDD voltage, to a first node 315-a of transistor 325-a (e.g., a drain node of a p-type transistor or a source node of an n-type transistor). Voltage generator 305-a may generate a voltage that may be provided to a control node 310-a of the transistor 325-a (e.g., a gate of transistor 325-a). That is, voltage generator 305-a may be configured to bias (e.g., set) the control node 310-a to a voltage to control an amount of current that flows through transistor 325-a. In some cases, changing the voltage at the control node 310-a corresponds to changing the amount of current provided to the array of memory cells 370. In some cases, voltage generator 305-a may be configured to adjust its output voltage (e.g., to bias the control node 310-a) based on the current demand from the array of memory cells 370, e.g., to adapt to the current demand of the array of memory cells 370.

In some cases, voltage generator 305-a may be in communication with a controller, such as local memory controller 165, 260, device memory controller 155, or external memory controller 105 described with reference to FIGS. 1 and 2. The controller may indicate (e.g., by a control signal) an output voltage to be generated by voltage generator 305-a. In some cases, the controller may adjust the control signal based on the current demand of the array of memory cells 370 to cause the voltage generator 305-a to correspondingly adjust its output voltage.

In some cases, the amount of current supplied to the array of memory cells 370 relative to the initial amount of current supplied to the array of memory cells 370 may indicate a level of degradation of the array of memory cells 370 (e.g., as the array of memory cells 370 degrades, the supply current increases). Consequently, monitoring for changes in the voltage at the control node 310-a of transistor 325-a, which may correspond to changes in the amount of current supplied to the array of memory cells 370, may enable a memory die to determine a level of degradation of the array of memory cells 370.

In some cases, system 300 may include a "dummy" voltage generator, such as voltage generator 305-b, that may be used to supply a reference voltage against which the voltage at control node 310-a may be compared to monitor for changes over time in the voltage at control node 310-a. In some cases, the dummy voltage generator 305-b may be isolated from the array of memory cells 370. In some cases, the reference voltage may be determined (e.g., set) by trimming (e.g., adjusting the output of) voltage generator 305-b to match (or substantially match) an initial value of the voltage supplied by voltage generator 305-a. Such a voltage may correspond to a reference voltage, which may be a voltage supplied by voltage generator 305-a to control node 310-a to enable an initial amount of supply current to flow through transistor 325-a to the array of memory cells 370. In some cases, a controller may trim the voltage generator 305-b to output a same voltage as voltage generator 305-a at a first time, such as during an initialization or bootup of the system 300. In some cases, voltage generator 305-a may be configured before deployment (e.g., via a factory setting) to output a voltage that matches the voltage of voltage generator 305-b. In this case, voltage generator 305-b may output a constant voltage over time (e.g., even if the system 300 re-initializes or reboots).

In some cases, voltage generator 305-b may be coupled with a control node 310-b of a transistor 325-b. Transistor 325-b may be, for example, a p-type or n-type MOS transistor, or another type of transistor. In some cases, transistor 325-b may be the same type of transistor as transistor 325-a, or may be a different type of transistor. Transistor 325-b may have a first node 315-b (e.g., a drain node, for a p-type transistor) coupled with voltage supply 330-b, which may be a same voltage supply as voltage supply 330-a. Transistor 325-b may have a second node 320-b (e.g., a source node, for a p-type transistor). The second node 320-b may be a floating node; e.g., the second node 320-b may not be coupled with (e.g., may be isolated from) other components in system 300, including array of memory cells 370. Therefore, while the voltage at the control node 310-a may change over time (e.g., corresponding to a change in the current supplied to the array of memory cells 370), the voltage at the control node 310-b may remain relatively constant over time, thereby serving as a reference voltage.

Comparison component 340 may be coupled with voltage generator 305-a and with voltage generator 305-b, and may be configured to determine a difference between the voltage that is output by voltage generator 305-a (e.g., the voltage at control node 310-a) and the voltage that is output by voltage generator 305-b (e.g., the reference voltage). In some cases, the two voltages may match (or substantially match) each other at the first time, when voltage generator 305-b is adjusted to match voltage generator 305-a. In some cases, the two voltages may not match (e.g., may differ) at a second time after the first time if the array of memory cells 370 begins to draw more or less current due to, for example, degradation of the transistors in the memory cells.

In some cases, comparison component 340 may determine a magnitude of the difference between two voltages. In some cases, the magnitude of the difference between the monitored voltage (e.g., the voltage of control node 310-a) and the reference voltage (e.g., the voltage of control node 310-b) may indicate an amount of degradation of the array of memory cells 370. For example, as the current supply for the array of memory cells 370 increases or decreases (e.g., due to a degradation of one or more components within the array of memory cells 370), the control node 310-a voltage may proportionally increase or decrease to adjust the current supplied to the array of memory cells 370.

In some cases, comparison component 340 may determine whether the two voltages differ by at least a threshold amount. For example, comparison component 340 may determine whether the two voltages differ by at least a threshold amount that may indicate a higher level of degradation. For example, in some cases, threshold amount may be a critical threshold amount that may correspond to a voltage difference (e.g., between the voltage at control node 310-a and the voltage at control node 310-b, or between some other monitored voltage and reference voltage) that indicates that the array of memory cells 370 may have degraded such that the reliability of the array of memory cells 370 may have fallen below a critical level. Here, if the voltages of the control nodes 310 do not differ by at least the threshold amount, the comparison component 340 may output a signal 345 with a first logic state (e.g., a logic state '0'), which may indicate that the reliability of the array of memory cells 370 has not fallen below the critical level. Alternatively, if the voltages of the control nodes 310 differ by at least the threshold amount, the comparison component 340 may output a signal 345 with a second logic state (e.g., a logic state '1').

In some cases, comparison component 340 may be configured to determine whether the two voltages differ by multiple threshold amounts; e.g., by a first threshold amount, a second threshold amount that may be higher than the first threshold amount, a third threshold amount that may be higher than the second threshold amount, etc. That is, comparison component 340 may be configured to determine various levels of difference between the two voltages, corresponding to various levels of degradation. In some cases, the threshold amounts (and corresponding ranges) that are used to characterize the status of the array of memory cells 370 (e.g., by selecting corresponding status indicators) may be preconfigured at the system 300. In another case, the threshold amounts may be indicated to the system 300 by the host device. In some cases, the threshold amounts may be fixed (e.g., hardwired) in hardware of the memory device, or may be configurable with a mode register.

In some cases, comparison component 340 may include one or more comparators and/or differential amplifiers. In an example where the comparison component 340 includes a comparator, a tolerance of the comparator may be set to a threshold amount such that the comparator is configured to output one value (e.g., a "0") if the voltages differ by less than the threshold amount and another value (e.g., a "1") if the voltages differ by at least the threshold amount.

In the case that the comparison component 340 includes one or more comparators, the signal 345 may indicate a range of the magnitude of the voltage difference. Alternatively, if the comparison component 340 includes a differential amplifier, the signal 345 may indicate the magnitude of the voltage difference itself.

In some cases, comparison component 340 may include more than one comparator. Here, different comparators may have different tolerances. In this example, the output of the comparison component 340 may indicate a range of the magnitude of a voltage difference (e.g., between control nodes 310). For example, if the comparison component 340 includes three comparators, a first comparator may have a first tolerance (e.g., 100 millivolts (mV)) corresponding to a first threshold amount, a second comparator may have a second tolerance (e.g., 200 mV) corresponding to a second threshold amount, and a third comparator may have a third tolerance (e.g., 500 mV) corresponding to a third threshold amount. Here, the signal 345 may include three signals (one from each of the comparators) or may include a combined signal indicating some combination of the outputs of the three comparators. For example, if all three of the signals (e.g., one from each of the three comparators) indicate a logic value "0," the signal 345 may indicate that the voltage difference (e.g., between control nodes 310) may be less than 100 mV. Alternatively, if a signal from the first and second comparator are a logic value "1" and a signal from the third comparator is a logic value "0," the signal 345 may indicate that the voltage difference is between 200 mV and 500 mV.

In some cases, comparison component 340 may be coupled with logic circuitry 350, and may output a signal 345 to logic circuitry 350 based on the difference between the two voltages. For example, comparison component 340 may output a signal 345 that indicates the difference between the two voltages, or that indicates the magnitude of the difference between the two voltages, or that indicates that the voltages differ by at least a threshold amount, or that indicates that the difference of the voltages falls within a particular range between threshold amounts, or a combination thereof.

In some cases, logic circuitry 350 may receive the signal 345 from comparison component 340 and may output a status indicator 355 based on the signal 345. The status indicator 355 may indicate a level of degradation of the array of memory cells 370. For example, a first status indicator may correspond to a relatively low amount of degradation of the array of memory cells 370 and a second status indicator may correspond to a higher amount of degradation of the array of memory cells 370. Here, the first status indicator may correspond to a first difference between the voltages of the control nodes 310 (e.g., as indicated by signal 345) and the second status indicator may correspond to a second difference between the voltages of the control nodes 310. In this example, the first difference may be less than the second difference (e.g., corresponding to less degradation of the array of memory cells 370).

In some cases, logic circuitry 350 may identify the status indicator 355 before outputting the status indicator 355. Logic circuitry may identify the status indicator 355 based on the threshold amount. In some cases, logic circuitry may identify the status indicator 355 by selecting the status indicator 355 from a set of status indicators, where each status indicator in the set is associated with a different threshold amount or combination of threshold amounts. For example, if the signal 345 indicates that the difference between the voltages of the control nodes 310 is less than a first threshold amount, the logic circuitry 350 may identify a first status indicator. If signal 345 indicates that the difference between the voltages at the control nodes 310 exceeds a first threshold amount but is less than a second threshold amount, the logic circuitry 350 may identify a second status indicator. If the signal 345 indicates that the difference between the voltages of the control nodes 310 exceeds the second threshold, the logic circuitry 350 may identify a third status indicator.

In some cases, logic circuitry 350 may determine, based on signal 345, whether the voltages of control nodes 310 differ by at least the threshold amount (e.g., instead of comparison component 340 performing this determination).

In some cases, logic circuitry 350 may output status indicator 355 to an external device, such as an external host device. In some cases, logic circuitry 350 may output status indicator 355 by writing the status indicator 355 to an on-die storage component 365, such as a register, which may subsequently be read by an external device. For example, a host device may determine the status of the array of memory cells 370 by polling one or more registers (e.g., storage components 365) containing one or more status indicators that indicate the status of the array of memory cells 370.

In some cases, logic circuitry 350 may output status indicator 355 by incrementing a register or programming a one-time programmable storage element, such as by blowing a fuse.

In some cases, the status indicator 355 may be output by setting (e.g., writing) a flag indicating degradation of the array of memory cells 370, such as in a register. For example, the status indicator 355 may be either a logic value '0' if the magnitude of the difference between the voltages of the control nodes 310 is below a certain threshold amount (e.g., a critical threshold amount) and a logic value '1' if the magnitude of the difference between the voltages of the control nodes 310 exceeds the threshold amount.

In some cases, logic circuitry 350 may identify an output location (e.g., a storage component 365, host processor, or other location) for outputting the status indicator 355 based on the threshold amount, and may output status indicator 355 to the identified output location. For example, logic circuitry 350 may determine whether to output the status indicator 355 to a storage component 365 or to an external host processor based on a threshold amount associated with the status indicator 355. For example, if the voltages differ by at least a first threshold amount that is fairly small, which may indicate minimal degradation, logic circuitry 350 may output the status indicator 355 to storage component 365, which may subsequently be read by the host processor at a later time. If the voltages differ by at least a second threshold amount that is fairly large, which may indicate significant degradation, logic circuitry 350 may output the status indicator 355 by transmitting the status indicator 355 directly to the host processor to quickly alert the host processor that there may be significant degradation.

In some cases, logic circuitry 350 may identify a timing mode (e.g., synchronous timing or asynchronous timing) for outputting the status indicator 355 based on the threshold amount, and may output status indicator 355 based on the identified timing mode. For example, logic circuitry 350 may determine whether to transmit the status indicator 355 to a host processor synchronously or asynchronously based on a threshold amount associated with the status indicator 355. For example, if the voltages differ by at least a first threshold amount that is fairly small, which may indicate minimal degradation, logic circuitry 350 may transmit the status indicator 355 to the host processor synchronously; e.g., by synchronizing the transmission with a system clock signal. If the voltages differ by at least a second threshold amount that is fairly large, which may indicate significant degradation, logic circuitry 350 may transmit the status indicator 355 to the host processor asynchronously; e.g., without waiting to synchronize transmission with a system clock signal.

Figure 4:
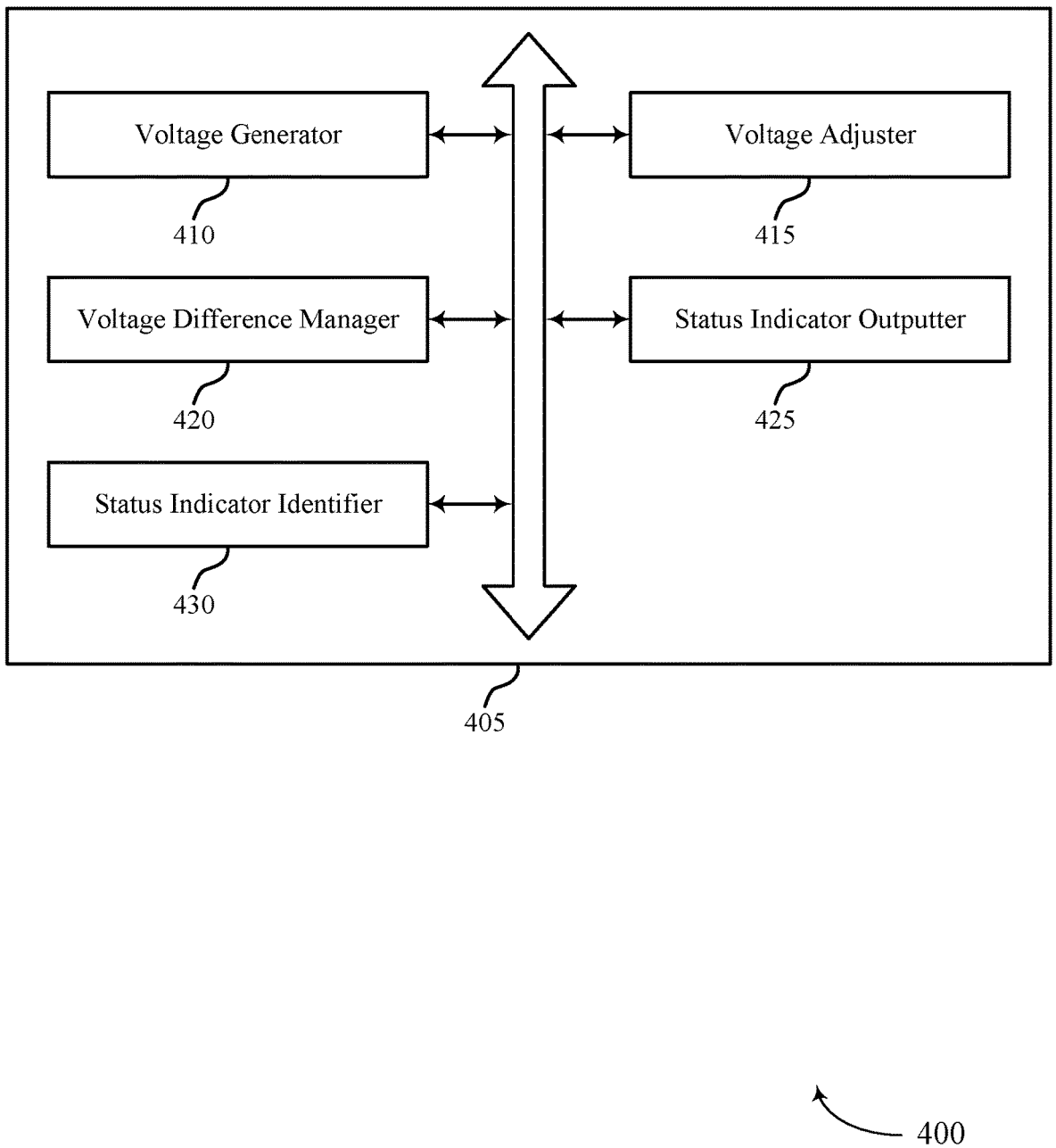
FIG. 4 shows a block diagram of a memory device that supports a current monitor for a memory device in accordance with examples as disclosed herein.

FIG. 4 shows a block diagram 400 of a memory device 405 that supports current monitor for a memory device in accordance with examples as disclosed herein. The memory device 405 may be an example of aspects of a memory device as described with reference to FIGS. 1 through 3. The memory device 405 may include a voltage generator 410, a voltage adjuster 415, a voltage difference manager 420, a status indicator outputter 425, and a status indicator identifier 430. Each of these modules may communicate, directly or indirectly, with one another (e.g., via one or more buses).

The voltage generator 410 may bias a control node of a transistor to a first voltage supplied by a first voltage generator, the control node associated with controlling an amount of current supplied to one or more components on a device. In some cases, the one or more components include an array of memory cells.

The voltage adjuster 415 may adjust, at a first time while the control node is biased to the first voltage, a second voltage supplied by a second voltage generator to match the first voltage.

The voltage difference manager 420 may determine, at a second time after the first time, that the first voltage differs from the second voltage by at least a threshold amount. In some examples, the voltage difference manager 420 may determine a magnitude of a difference between the first voltage and the second voltage. In some cases, the voltage difference manager 420 may determine a difference between the first voltage and the second voltage, where determining that the first voltage differs from the second voltage by at least the threshold amount is based on determining the difference between the first voltage and the second voltage. In some instances, the voltage difference manager 420 may determine, at a third time after the second time, that the first voltage differs from the second voltage by a second threshold amount. In some examples, the voltage difference manager 420 may determine, at a fourth time after the first time and before the second time, that the first voltage differs from the second voltage by less than the threshold amount.

The status indicator outputter 425 may output, based on determining that the first voltage differs from the second voltage by at least the threshold amount, a status indicator indicating that the first voltage differs from the second voltage by at least the threshold amount. In some examples, the voltage difference manager 420 may output a signal representing the difference, where outputting the status indicator is based on the signal.

In some examples, the status indicator outputter 425 may identify an output location based on the threshold amount, where outputting the status indicator includes outputting the status indicator to the output location. In some cases, the output location includes a storage component on the device. In some instances, the output location includes an external host device, and where outputting the status indicator includes transmitting the status indicator to the external host device. In some examples, the status indicator outputter 425 may output a second status indicator based on determining that the first voltage differs from the second voltage by the second threshold amount. In some cases, outputting the status indicator includes writing the status indicator to a register on the device and outputting the second status indicator includes transmitting the second status indicator to an external host device. In some examples, the status indicator outputter 425 may output, to a host device, a third status indicator based on determining that the first voltage differs from the second voltage by less than the threshold amount.

In some examples, the status indicator outputter 425 may identify, based on the threshold amount, a timing mode associated with outputting the status indicator, where outputting the status indicator is based on identifying the timing mode. In some examples, outputting the status indicator includes synchronously transmitting the status indicator to an external host device and outputting the second status indicator includes asynchronously transmitting the second status indicator to the external host device. In some cases, the timing mode includes an asynchronous timing mode, and outputting the status indicator includes transmitting the status indicator to an external host device asynchronously based on the timing mode.

The status indicator identifier 430 may identify the status indicator based on the threshold amount, where the identifying the status indicator occurs before outputting the status indicator. In some examples, identifying the status indicator includes selecting, based on the threshold amount, the status indicator from a set of status indicators, each status indicator of the set of status indicators associated with one or more threshold amounts. In some cases, the status indicator identifier 430 may identify the status indicator based on the magnitude of the difference.

Figure 5:
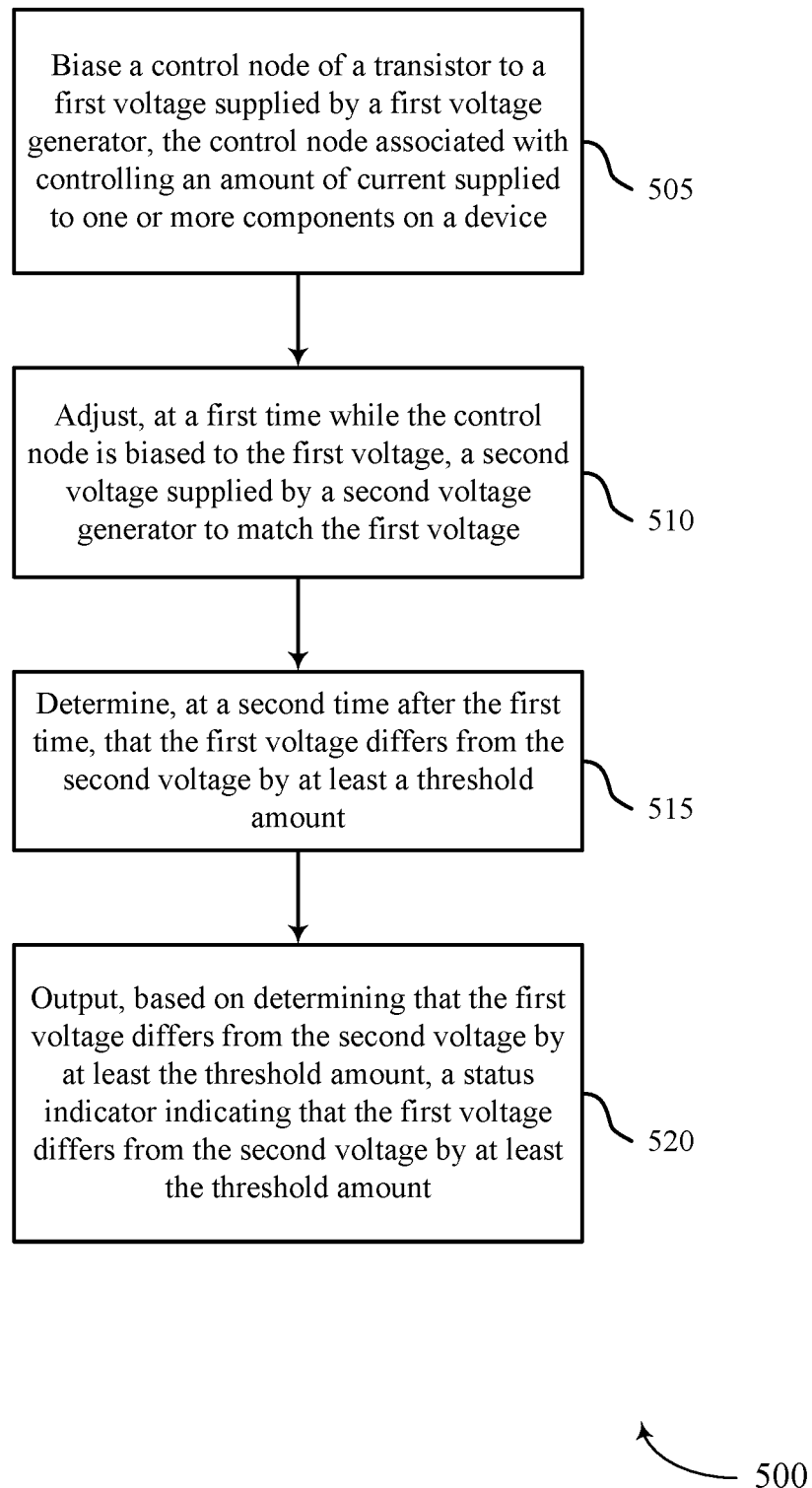
FIGS. 5 and 6 show flowcharts illustrating a method or methods that support a current monitor for a memory device in accordance with examples as disclosed herein.

FIG. 5 shows a flowchart illustrating a method or methods 500 that supports a current monitor for a memory device in accordance with examples as disclosed herein. The operations of method 500 may be implemented by a memory device or its components as described herein. For example, the operations of method 500 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 505, the memory device may bias a control node of a transistor to a first voltage supplied by a first voltage generator, the control node associated with controlling an amount of current supplied to one or more components on a device. The operations of 505 may be performed according to the methods described herein. In some examples, aspects of the operations of 505 may be performed by a voltage generator as described with reference to FIG. 4.

At 510, the memory device may adjust, at a first time while the control node is biased to the first voltage, a second voltage supplied by a second voltage generator to match the first voltage. The operations of 510 may be performed according to the methods described herein. In some examples, aspects of the operations of 510 may be performed by a voltage adjuster as described with reference to FIG. 4.

At 515, the memory device may determine, at a second time after the first time, that the first voltage differs from the second voltage by at least a threshold amount. The operations of 515 may be performed according to the methods described herein. In some examples, aspects of the operations of 515 may be performed by a voltage difference manager as described with reference to FIG. 4.

At 520, the memory device may output, based on determining that the first voltage differs from the second voltage by at least the threshold amount, a status indicator indicating that the first voltage differs from the second voltage by at least the threshold amount. The operations of 520 may be performed according to the methods described herein. In some examples, aspects of the operations of 520 may be performed by a status indicator outputter as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for biasing a control node of a transistor to a first voltage supplied by a first voltage generator, the control node associated with controlling an amount of current supplied to one or more components on a device. The apparatus may further include features, means, or instructions for adjusting, at a first time while the control node is biased to the first voltage, a second voltage supplied by a second voltage generator to match the first voltage, determining, at a second time after the first time, that the first voltage differs from the second voltage by at least a threshold amount, and outputting, based on determining that the first voltage differs from the second voltage by at least the threshold amount, a status indicator indicating that the first voltage differs from the second voltage by at least the threshold amount.

In some cases of the method 500 and the apparatus described herein, the one or more components include an array of memory cells.

Some examples of the method 500 and the apparatus described herein may further include operations, features, means, or instructions for identifying the status indicator based on the threshold amount, where the identifying the status indicator occurs before outputting the status indicator.

Some instances of the method 500 and the apparatus described herein may further include operations, features, means, or instructions for identifying the status indicator includes selecting, based on the threshold amount, the status indicator from a set of status indicators, each status indicator of the set of status indicators associated with one or more threshold amounts.

Some examples of the method 500 and the apparatus described herein may further include operations, features, means, or instructions for determining a magnitude of a difference between the first voltage and the second voltage, and identifying the status indicator based on the magnitude of the difference.

Some cases of the method 500 and the apparatus described herein may further include operations, features, means, or instructions for identifying an output location based on the threshold amount, where outputting the status indicator includes outputting the status indicator to the output location.

In some examples of the method 500 and the apparatus described herein, the output location includes a storage component on the device.

In some instances of the method 500 and the apparatus described herein, the output location includes an external host device, and where outputting the status indicator includes transmitting the status indicator to the external host device.

Some cases of the method 500 and the apparatus described herein may further include operations, features, means, or instructions for identifying, based on the threshold amount, a timing mode associated with outputting the status indicator, where outputting the status indicator may be based on identifying the timing mode.

In some examples of the method 500 and the apparatus described herein, the timing mode includes an asynchronous timing mode, and where outputting the status indicator includes transmitting the status indicator to an external host device asynchronously based on the timing mode.

Some instances of the method 500 and the apparatus described herein may further include operations, features, means, or instructions for determining a difference between the first voltage and the second voltage, where determining that the first voltage differs from the second voltage by at least the threshold amount may be based on determining the difference between the first voltage and the second voltage, and outputting a signal representing the difference, where outputting the status indicator may be based on the signal.

Some examples of the method 500 and the apparatus described herein may further include operations, features, means, or instructions for determining, at a third time after the second time, that the first voltage differs from the second voltage by a second threshold amount, and outputting a second status indicator based on determining that the first voltage differs from the second voltage by the second threshold amount.

In some cases of the method 500 and the apparatus described herein, outputting the status indicator may include operations, features, means, or instructions for writing the status indicator to a register on the device and outputting the second status indicator.

Some instances of the method 500 and the apparatus described herein may further include operations, features, means, or instructions for outputting the status indicator includes synchronously transmitting the status indicator to an external host device and outputting the second status indicator includes asynchronously transmitting the second status indicator to the external host device.

Some examples of the method 500 and the apparatus described herein may further include operations, features, means, or instructions for determining, at a fourth time after the first time and before the second time, that the first voltage differs from the second voltage by less than the threshold amount, and outputting, to a host device, a third status indicator based on determining that the first voltage differs from the second voltage by less than the threshold amount.

Figure 6:
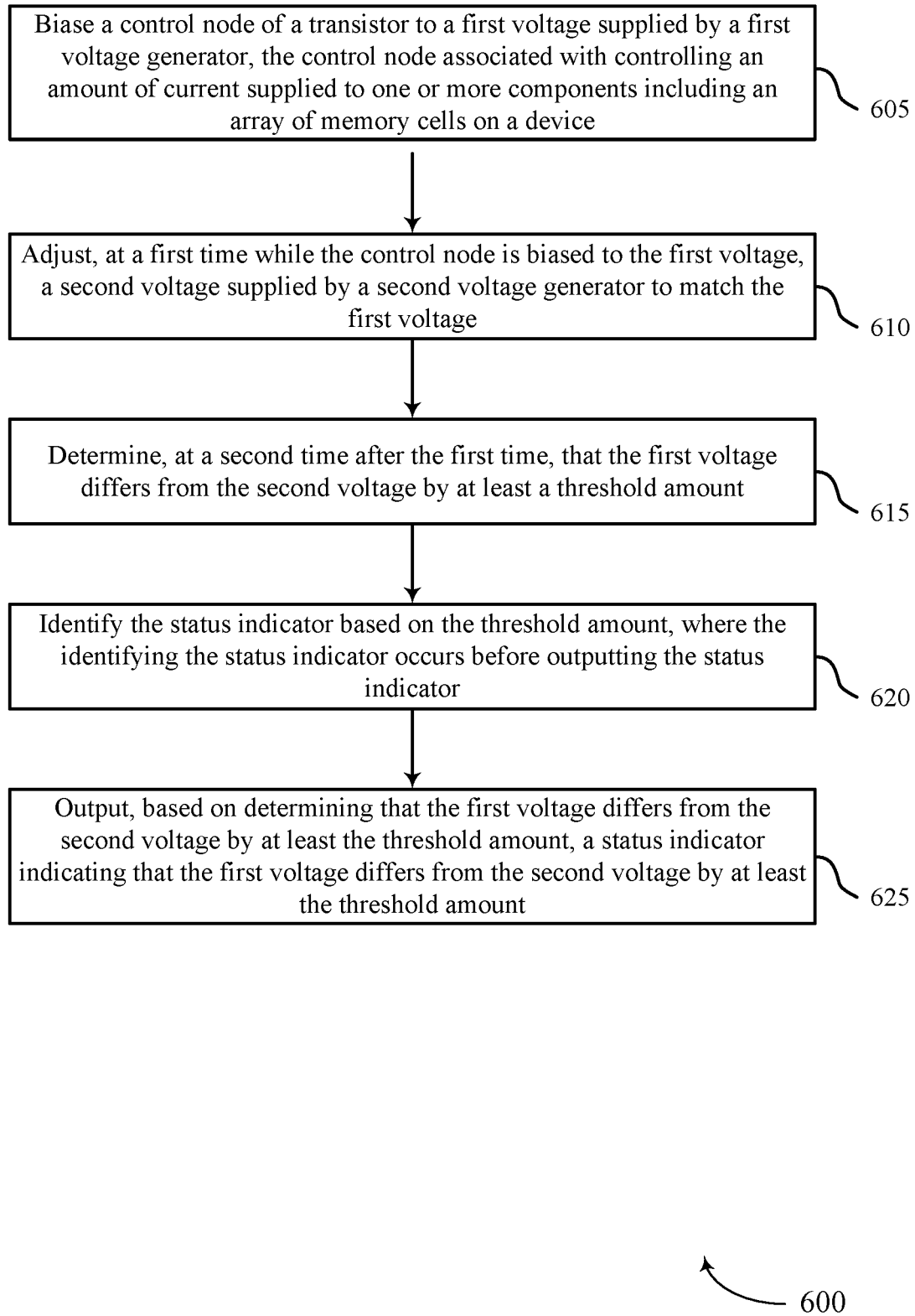

FIG. 6 shows a flowchart illustrating a method or methods 600 that supports a current monitor for a memory device in accordance with examples as disclosed herein. The operations of method 600 may be implemented by a memory device or its components as described herein. For example, the operations of method 600 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 605, the memory device may bias a control node of a transistor to a first voltage supplied by a first voltage generator, the control node associated with controlling an amount of current supplied to one or more components including an array of memory cells on a device. The operations of 605 may be performed according to the methods described herein. In some examples, aspects of the operations of 605 may be performed by a voltage generator as described with reference to FIG. 4.

At 610, the memory device may adjust, at a first time while the control node is biased to the first voltage, a second voltage supplied by a second voltage generator to match the first voltage. The operations of 610 may be performed according to the methods described herein. In some examples, aspects of the operations of 610 may be performed by a voltage adjuster as described with reference to FIG. 4.

At 615, the memory device may determine, at a second time after the first time, that the first voltage differs from the second voltage by at least a threshold amount. The operations of 615 may be performed according to the methods described herein. In some examples, aspects of the operations of 615 may be performed by a voltage difference manager as described with reference to FIG. 4.

At 620, the memory device may identify the status indicator based on the threshold amount, where the identifying the status indicator occurs before outputting the status indicator. The operations of 620 may be performed according to the methods described herein. In some examples, aspects of the operations of 620 may be performed by a status indicator identifier as described with reference to FIG. 4.

At 625, the memory device may output, based on determining that the first voltage differs from the second voltage by at least the threshold amount, a status indicator indicating that the first voltage differs from the second voltage by at least the threshold amount. The operations of 625 may be performed according to the methods described herein. In some examples, aspects of the operations of 625 may be performed by a status indicator outputter as described with reference to FIG. 4.

It should be noted that the methods described above describe possible implementations, and that the operations and the steps may be rearranged or otherwise modified and that other implementations are possible. Furthermore, portions from two or more of the methods may be combined.

In some examples, an apparatus including a current monitor for a memory device may perform aspects of the function described herein using general- or special-purpose hardware. The apparatus may include an array of memory cells, a transistor having a control node associated with controlling an amount of a current supplied to the array of memory cells, a first voltage generator configured to bias the control node of the transistor to a first voltage at a first time, and a second voltage generator configured to output a second voltage that matches the first voltage at the first time. The apparatus may further include a comparison component coupled with the first voltage generator and the second voltage generator and configured to determine, at a second time after the first time, a difference between the first voltage and the second voltage, output a signal based on the difference. The apparatus may further include logic circuitry coupled with the comparison component and configured to receive the signal and output a status indicator based on the signal.

In some examples, the transistor may include a first node coupled with a supply voltage for the array of memory cells, and a second node coupled with the array of memory cells and configured to supply the current to the array of memory cells based on the first voltage.

In some cases, the apparatus may further include a second transistor including a second control node configured to receive the second voltage, a third node coupled with the supply voltage, and a floating fourth node.

In some instances, the logic circuitry may be configured to identify the status indicator based on the signal.

In some examples, the comparison component includes a comparator configured to determine whether the first voltage differs from the second voltage by at least a threshold amount, where the signal may be based on determining whether the first voltage differs from the second voltage by at least the threshold amount.

In some cases, the signal includes a representation of the difference.

In some instances, the logic circuitry is further configured to compare the difference between the first voltage and the second voltage to one or more thresholds stored at the apparatus, where each of the one or more thresholds corresponds to a change in status of operation of the array of memory cells.

In some examples, an apparatus including a current monitor for a memory device may perform aspects of the function described herein using general- or special-purpose hardware. The apparatus may include an array of memory cells that each include a capacitive storage component, a controller coupled with the array of memory cells and operable to cause the apparatus to, adjust, at a first time while the control node is biased to the first voltage, a second voltage supplied by a second voltage generator to match the first voltage, determine, at a second time after the first time, that the first voltage differs from the second voltage by at least a threshold amount, and output, based on the determination that the first voltage differs from the second voltage by at least the threshold amount, a status indicator indicating that the first voltage differs from the second voltage by at least the threshold amount.

In some examples, the controller is further operable to identify the status indicator based on the threshold amount, where outputting the status indicator may be based on identifying the status indicator.

In some cases, the controller is further operable to identify the status indicator based on the threshold amount, where the identifying the status indicator occurs prior to the outputting the status indicator.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed:
1. A method, comprising:
biasing, at a first time, a gate of a switching component to a first voltage supplied by a first voltage generator, the gate configured to adjust an amount of current supplied to one or more components;
determining, at a second time after the first time, that a second voltage supplied by the first voltage generator to the gate of the switching component differs from the first voltage by at least a threshold amount; and
outputting a status indicator based at least in part on the second voltage differing from the first voltage by at least the threshold amount.

2. The method of claim 1, further comprising:
adjusting, based at least in part on biasing the gate to the first voltage, an output of a second voltage generator based at least in part on the first voltage, wherein determining that the second voltage differs from the first voltage by at least the threshold amount is based at least in part on the adjusting.

3. The method of claim 2, further comprising:
comparing, after the first time, the first voltage output by the second voltage generator to the second voltage output by the first voltage generator, wherein determining that the second voltage differs from the first voltage by at least the threshold amount is based at least in part on the adjusting.

4. The method of claim 1, wherein the one or more components comprise an array of memory cells.

5. The method of claim 1, further comprising:
identifying the status indicator based at least in part on the threshold amount, wherein the identifying the status indicator occurs before outputting the status indicator.

6. The method of claim 5, wherein:
identifying the status indicator comprises selecting, based at least in part on the threshold amount, the status indicator from a set of status indicators, each status indicator of the set of status indicators associated with one or more respective threshold amounts.

7. The method of claim 1, further comprising:
determining a magnitude of a difference between the second voltage and the first voltage; and
identifying the status indicator based at least in part on the magnitude of the difference, wherein outputting the status indicator is based at least in part on the identifying.

8. The method of claim 1, further comprising:
identifying an output location based at least in part on the threshold amount, wherein outputting the status indicator comprises outputting the status indicator to the output location.

9. The method of claim 8, wherein the output location comprises a location in a storage component.

10. The method of claim 8, wherein:
the output location comprises a location in an external host device; and
outputting the status indicator comprises transmitting the status indicator to the external host device.

11. The method of claim 1, further comprising:
identifying, based at least in part on the threshold amount, a timing mode associated with outputting the status indicator, wherein outputting the status indicator is based at least in part on identifying the timing mode.

12. The method of claim 11, wherein:
the timing mode comprises an asynchronous timing mode; and
outputting the status indicator comprises transmitting the status indicator to an external host device asynchronously based at least in part on the timing mode.

13. The method of claim 1, further comprising:
determining a difference between the second voltage and the first voltage, wherein determining that the second voltage differs from the first voltage by at least the threshold amount is based at least in part on determining the difference between the second voltage and the first voltage; and
outputting a signal representing the difference, wherein outputting the status indicator is based at least in part on the signal.

14. An apparatus, comprising:
an array of memory cells,
a switching component having a gate configured to adjust an amount of a current supplied to the array of memory cells,
a first voltage generator configured to:
bias the gate of the switching component to a first voltage at a first time; and
bias the gate of the switching component to a second voltage after the first time;
a comparison component coupled with the first voltage generator and configured to:
determine, at a second time, a difference between the first voltage and the second voltage; and
output a signal based at least in part on the difference between the first voltage and the second voltage; and
logic circuitry coupled with the comparison component and configured to receive the signal and output a status indicator based at least in part on the signal.

15. The apparatus of claim 14, further comprising:
a second voltage generator coupled with the comparison component and configured to output, to the comparison component after the first time, the first voltage that matches an output the first voltage generator at the first time.

16. The apparatus of claim 15, further comprising a second switching component comprising:
a second gate configured to receive the first voltage from the second voltage generator,
a first node coupled with a supply voltage for the array of memory cells, and
a second node configured to be floating.

17. The apparatus of claim 14, wherein the switching component comprises:
a first node coupled with a supply voltage for the array of memory cells; and
a second node coupled with the array of memory cells and configured to supply the current to the array of memory cells based at least in part on the gate of the switching component being biased to the first voltage.

18. The apparatus of claim 14, wherein the logic circuitry is configured to identify the status indicator based at least in part on the signal.

19. The apparatus of claim 14, wherein the comparison component comprises a comparator configured to determine whether the first voltage differs from the second voltage by at least a threshold amount, wherein the signal is based at least in part on determining whether the first voltage differs from the second voltage by at least the threshold amount.

20. An apparatus, comprising:
an array of memory cells that each comprise a capacitive storage component; and
a controller coupled with the array of memory cells and operable to cause the apparatus to:
bias, at a first time, a gate of a switching component to a first voltage supplied by a first voltage generator, the gate configured to adjust an amount of current supplied to one or more components;
determine, at a second time after the first time, that a second voltage supplied by the first voltage generator to the gate of the switching component differs from the first voltage by at least a threshold amount; and
output a status indicator based at least in part on the second voltage differing from the first voltage by at least the threshold amount.

\* \* \* \* \*